(12) United States Patent
Shimoda et al.

(10) Patent No.: US 11,141,830 B2
(45) Date of Patent: Oct. 12, 2021

(54) METHOD FOR SETTING PROCESSING DEVICE

(71) Applicant: TOKYO SEIMITSU CO., LTD., Tokyo (JP)

(72) Inventors: Makoto Shimoda, Tokyo (JP); Masaki Kanazawa, Tokyo (JP)

(73) Assignee: Tokyo Seimitsu Co., LTD, Tokyo (JP)

( * ) Notice: Subject to any disclaimer, the term of this patent is extended or adjusted under 35 U.S.C. 154(b) by 171 days.

(21) Appl. No.: 16/315,645

(22) PCT Filed: Sep. 11, 2017

(86) PCT No.: PCT/JP2017/032611
§ 371 (c)(1),
(2) Date: Jan. 6, 2019

(87) PCT Pub. No.: WO2018/061721
PCT Pub. Date: Apr. 5, 2018

(65) Prior Publication Data
US 2019/0210178 A1    Jul. 11, 2019

(30) Foreign Application Priority Data

Sep. 28, 2016  (JP) .............................. JP2016-189068

(51) Int. Cl.
*B24B 7/04* (2006.01)
*B24B 41/06* (2012.01)
(Continued)

(52) U.S. Cl.
CPC ................ *B24B 7/04* (2013.01); *B24B 7/228* (2013.01); *B24B 41/06* (2013.01); *H01L 21/304* (2013.01)

(58) Field of Classification Search
CPC ........... B24B 7/04; B24B 7/228; B24B 7/241; B24B 25/00; B24B 27/0069;
(Continued)

(56) References Cited

U.S. PATENT DOCUMENTS 6,139,400 A * 10/2000 Sato ........................ B24B 37/04
451/10
6,220,945 B1 * 4/2001 Hirokawa ................ B24B 7/228
451/287
(Continued)

FOREIGN PATENT DOCUMENTS

JP        2002001653        1/2002
JP        2003007661        1/2003
(Continued)

OTHER PUBLICATIONS

International Preliminary Report on Patentability in corresponding International application No. PCT/JP2017/032611, 4 pages.
(Continued)

*Primary Examiner* — Orlando E Aviles
*Assistant Examiner* — Joel D Crandall
(74) *Attorney, Agent, or Firm* — Fattibene and Fattibene LLC; Paul A. Fettibene (57) ABSTRACT

Processing device for uniformly grinding wafers held by a plurality of chucks, and a method for setting the processing device. A processing device includes a coarse grinding device and a fine grinding device that are provided in a column straddling over a holding device. The holding device includes: an index table; chucks concentrically disposed about a rotation shaft; a first movable support unit on the outer peripheral side of the chuck in the radial direction of the index table; and a first fixed support unit on the inner peripheral side of the chuck in the radial direction of the index table. The first movable support unit is interposed
(Continued)

between the index table and the chuck, and can be freely expanded and contracted in a vertical direction.

1 Claim, 9 Drawing Sheets (51) Int. Cl.
 B24B 7/22 (2006.01)
 H01L 21/304 (2006.01)
(58) Field of Classification Search
 CPC ... B24B 27/0076; B24B 41/047; B24B 41/06; H01L 21/304
 See application file for complete search history.

(56) References Cited

U.S. PATENT DOCUMENTS

| | | | |
|---|---|---|---|
| 6,431,964 B1* | 8/2002 | Ishikawa | B24B 7/228 257/E21.23 |
| 6,656,818 B1 | 12/2003 | Kishimoto | 438/459 |
| 7,867,059 B2* | 1/2011 | Pietsch | B24B 7/17 451/11 |
| 10,173,296 B2* | 1/2019 | Kanazawa | B24B 47/14 |
| 10,421,172 B2* | 9/2019 | Shimoda | B24B 7/22 |
| 2002/0081954 A1* | 6/2002 | Mori | B24B 7/04 451/65 |
| 2012/0088441 A1* | 4/2012 | Yamanaka | H01L 21/304 451/402 |

FOREIGN PATENT DOCUMENTS

| | | |
|---|---|---|
| JP | 2004082291 | 3/2004 |
| JP | 2008044079 | 2/2008 |
| JP | 2010172999 | 8/2010 |
| JP | 2014069261 | 4/2014 |
| JP | 2016132071 | 7/2016 |
| JP | 2016155204 | 9/2016 |
| WO | WO 01/22484 | 3/2001 |

OTHER PUBLICATIONS

International Search Report, PCT/JP2017/032611, dated Oct. 31, 2017, 2 pages.

* cited by examiner

METHOD FOR SETTING PROCESSING DEVICE

FIELD OF THE INVENTION

The present invention relates to a method for setting processing device for carrying out a coarse grinding process and a fine grinding process on a wafer.

BACKGROUND OF THE INVENTION

In a semiconductor manufacturing field, in order to form a semiconductor wafer, such as a silicon wafer (hereinafter, referred to as "wafer"), into a thin film, a rear-surface grinding process for grinding the rear surface of a wafer is carried out.

As the processing device for grinding the rear surface of a wafer, Patent Document 1 has disclosed a plane processing device which is provided with a cassette housing stage, an alignment stage, a coarse grinding stage, a fine grinding stage, a polishing stage, a polishing cloth washing stage, a polishing cloth dressing stage and a wafer washing stage, and in which an index table moves the wafer to each of the stages. In this plane processing device, the wafer is sucked and held onto the same chuck in the coarse grinding process and the fine grinding process.

PRIOR ART DOCUMENTS

Patent Documents

Patent Document 1: JP-A No. 2003-7661

SUMMARY OF THE INVENTION

Problems to be Solved by the Invention

However, in the above-mentioned plane processing device described in Patent Document 1, problems arise in that variations might occur in the degree of in-plane flatness (TTV) of a wafer for each of the chucks in the case when processing conditions differ among chucks due to differences in the degree of surface flatness of each of the chucks, tilted rotation shafts of some of the chucks, or the like.

Therefore, a technical problem to be solved is raised in which wafers respectively held by a plurality of chucks need to be evenly ground, and the object of the present invention is to solve this problem.

Means to Solve the Problems

In order to achieve the above-mentioned object, the present invention is provided and the invention described in an embodiment provides a setting method for processing device that is carried out prior to a grinding process executed by using a processing device which is provided with a column formed so as to straddle over a holding means, and a coarse grinding means and a fine grinding means formed on the column, and in which the wafer held on the holding means is ground by the coarse grinding means and the fine grinding means, and the holding means is provided with an index table that is rotatable around the rotation shaft of the holding means, a plurality of chucks concentrically disposed centered on the rotation shaft on the index table, two first movable support units, each disposed on the outer peripheral side in the radial direction of the index table relative to the chuck and interposed between the index table and the chuck so as to be freely expanded or contracted in the vertical direction, and a first fixed support unit that is disposed on the inner peripheral side in the radial direction of the index table relative to the chuck and fixes one portion of the chuck in the vertical direction on the index table, the coarse grinding means includes a coarse grinding stone for use in grinding the wafer, a spindle for rotating the coarse grinding stone, a guide rail that slidably supports the spindle on the column and a tilting means for tilting the coarse grinding stone, and wherein the tilting means includes a tilt table interposed between the coarse grinding stone and the spindle, two second movable support units that are interposed between the guide rail and the tilt table and freely expanded or contracted in the vertical direction and a second fixed support unit that is disposed on a side opposite to the second movable support unit with the coarse grinding stone interposed in between so as to fix one portion of the tilt table in the vertical direction, forming the chuck face of the chuck flatly as well as vertically relative to the rotation shaft of the chuck by a fine grinding stone of the fine grinding means, tilting the rotation shaft by the first movable support unit so as to allow the rotation shaft of the chuck to be included within a predetermined range relative to the rotation shaft of the fine grinding stone, and tilting the rotation shaft of the coarse grinding stone so as to allow the rotation shaft of the coarse grinding stone to be included within a predetermined range relative to the rotation shaft of the chuck.

In accordance with this structure, since the first movable support units and the first fixed support unit are disposed so as to surround each of the chucks, each of the chucks is tilted based upon the first fixed support unit when the first movable support units are expanded or contracted so that the tilted angle (tilt angle) of the rotation shaft of each chuck can be adjusted individually; thus, variations in the degree of in-plane flatness of the wafer can be suppressed among the plurality of the chucks.

Moreover, since the first movable support unit is disposed on the outer peripheral side of the index table relative to the chuck, a worker who carries out maintenance on the first movable support unit can easily access to the first movable support unit from the side of the processing device so that it becomes possible to execute the maintenance work efficiently.

And, since the second movable support unit and the second fixed support unit are disposed so as to surround the coarse grinding stone, the coarse grinding stone is tilted based upon the second fixed support unit when the second movable support unit is expanded or contracted so that variations in the degree of in-plane flatness of the wafer can be further suppressed among the plurality of the chucks by adjusting the tilt at which the coarse grinding stone is made in contact with the chuck.

In addition, after the tilt of the rotation shaft of each of the plurality of chucks has been set based upon the rotation shaft of the fine grinding means, the tilt of the rotation shaft of the coarse grinding stone is set based upon the rotation shaft of the chuck so that variations in the degree of in-plane flatness of a wafer can be further suppressed among a plurality of chucks.

Effects of Invention

In the present invention, by disposing the first movable support unit and the first fixed support unit so as to surround each of the chucks, each chuck is tilted based upon the first fixed support unit when the first movable support unit is expanded or contracted so that the tilt angle of each chuck can be adjusted individually; therefore, variations in the degree of in-plane flatness of a wafer can be suppressed among a plurality of chucks. Moreover, since the first movable support unit is disposed on the outer peripheral side of the index table relative to the chuck, a worker who carries out maintenance on the first movable support unit can easily access to the first movable support unit from the side of the processing device so that it becomes possible to execute the maintenance work efficiently.

DESCRIPTIONS OF THE PREFERRED EMBODIMENTS

In order to achieve an object for uniformly grinding wafers respectively held on a plurality of chucks, a setting method for processing device relating to the present invention is designed as such a setting method for processing device that is carried out prior to a grinding process executed by using a processing device in which a column is formed so as to straddle over a holding means, and a coarse grinding means and a fine grinding means are formed on the column, and a wafer held on the holding means is processed to be ground by the coarse grinding means and the fine grinding means, and the holding means is provided with an index table that is rotatable around the rotation shaft of the holding means, a plurality of chucks concentrically disposed centered on the rotation shaft on the index table, two first movable support units, each disposed on the outer peripheral side in the radial direction of the index table relative to the chuck and interposed between the index table and the chuck so as to be freely expanded or contracted in the vertical direction, and a first fixed support unit that is disposed on the inner peripheral side in the radial direction of the index table relative to the chuck and fixes one portion of the chuck in the vertical direction on the index table, the coarse grinding means includes a coarse grinding stone for use in grinding the wafer, a spindle for rotating the coarse grinding stone, a guide rail that slidably supports the spindle on the column and a tilting means for tilting the coarse grinding stone, and wherein the tilting means includes a tilt table interposed between the coarse grinding stone and the spindle, two second movable support units that are interposed between the guide rail and the tilt table and freely expanded or contracted in the vertical direction, and a second fixed support unit that is disposed on a side opposite to the second movable support unit with the coarse grinding stone interposed in between so as to fix one portion of the tilt table in the vertical direction, forming the chuck face of the chuck flatly as well as vertically relative to the rotation shaft of the chuck by a fine grinding stone of the fine grinding means, tilting the rotation shaft by the first movable support unit so as to allow the rotation shaft of the chuck to be included within a predetermined range relative to the rotation shaft of the fine grinding stone, and tilting the rotation shaft of the coarse grinding stone so as to allow the rotation shaft of the coarse grinding stone to be included within a predetermined range relative to the rotation shaft of the chuck; thus, the above-mentioned object is achieved.

Embodiments

Referring to FIGS., the following description will discuss a processing device 1 relating to one embodiment of the present invention. Additionally, in the following embodiments, upon referring to the number, numeric values, amounts, ranges or the like of constituent elements, except for cases specifically indicated clearly or cases in which the number is clearly limited to a specific number on principle, its number is not intended to be limited by the specific number, and may be set to more or less than the specific number.

Moreover, upon referring to the shape and positional relationship of constituent elements or the like, except for cases specifically indicated clearly or cases in which that is clearly considered to be not the case on principle, those substantially include approximations, similarities or the like to its shape, etc.

Furthermore, those FIGS. are sometimes exaggerated by enlarging a specific part or the like so as to make its specific part clearly understood, and the dimensional ratio or the like of constituent elements is not necessarily the same as the actual value. Moreover, in the cross-sectional view, a hatched portion of one portion of a constituent element is sometimes omitted so as to make the cross-sectional structure of the constituent element easily understood.

Figure 1:
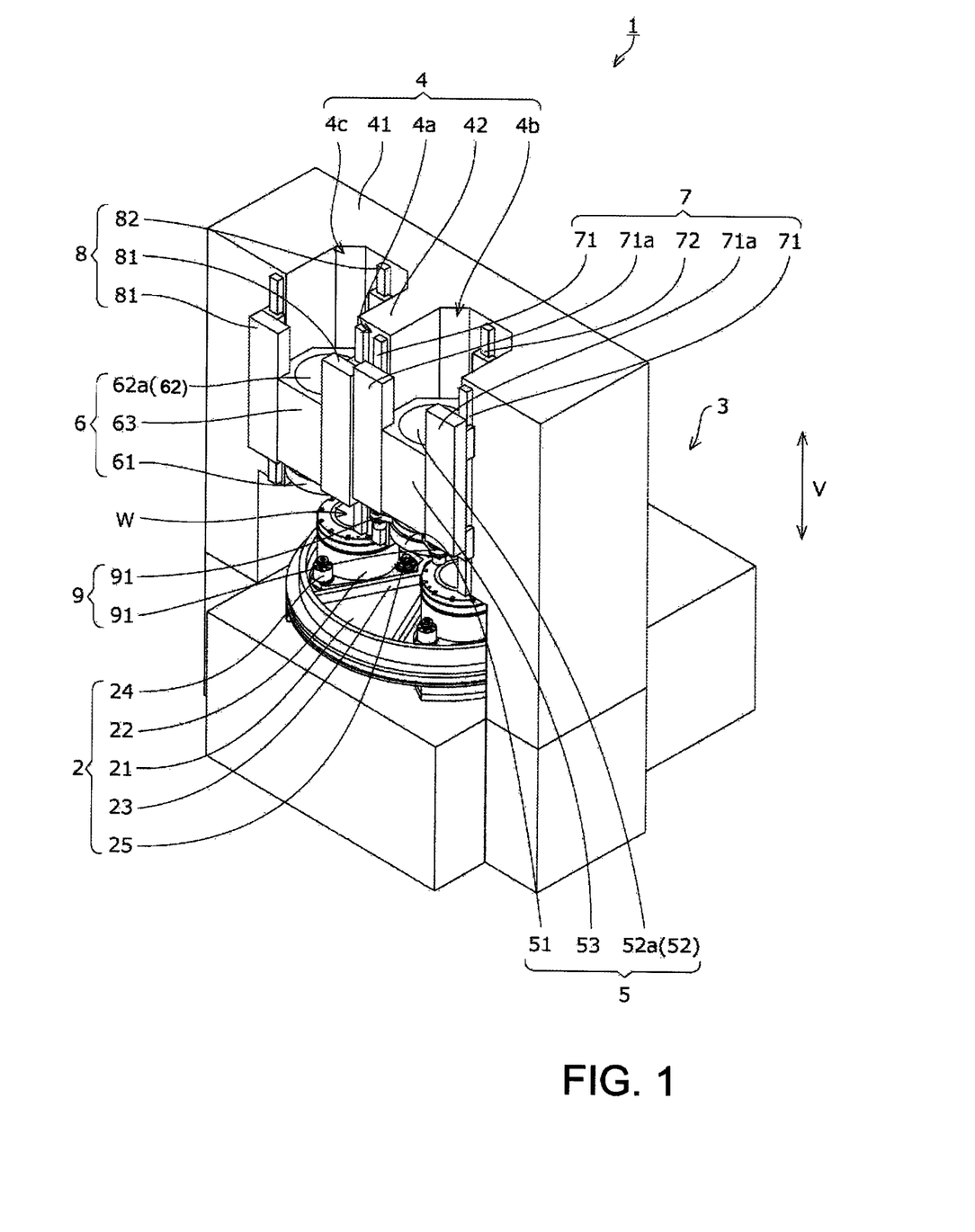
FIG. 1 is a perspective view showing a processing device relating to one embodiment of the present invention.
Figure 2:
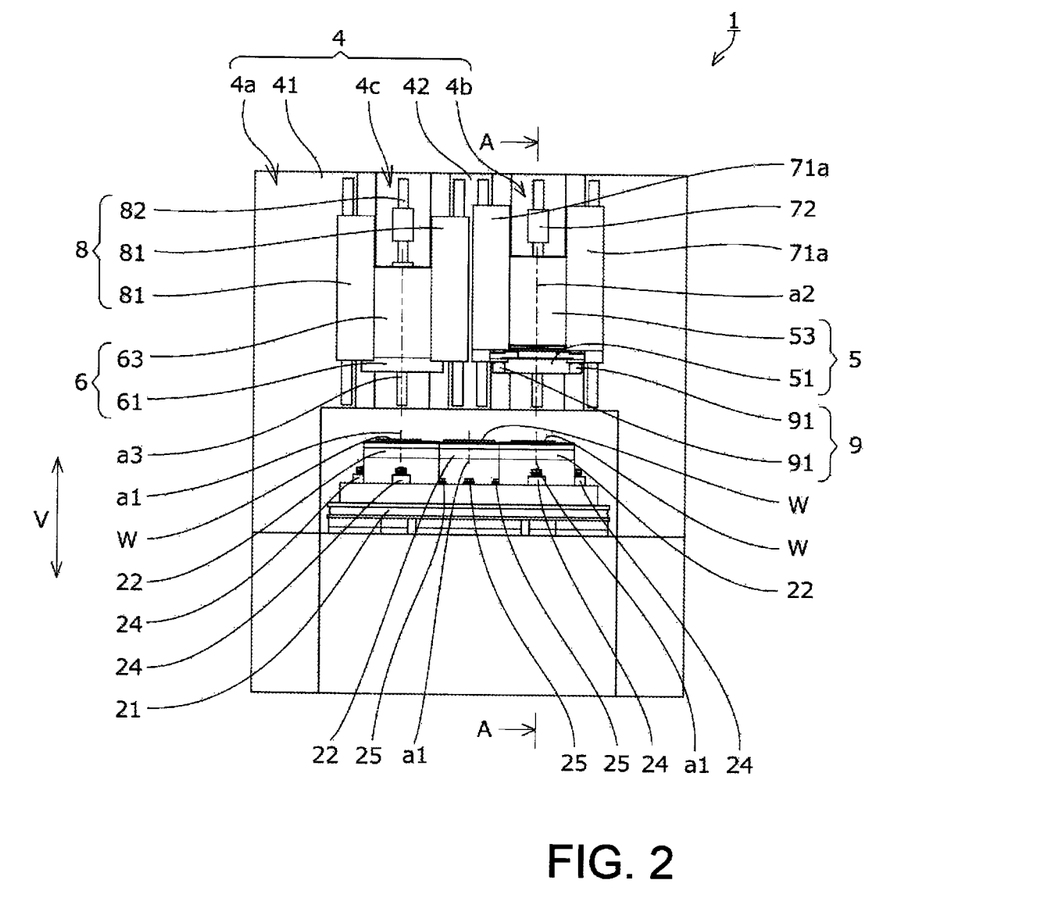
FIG. 2 is a front view of the processing device shown in FIG. 1.
Figure 3A:
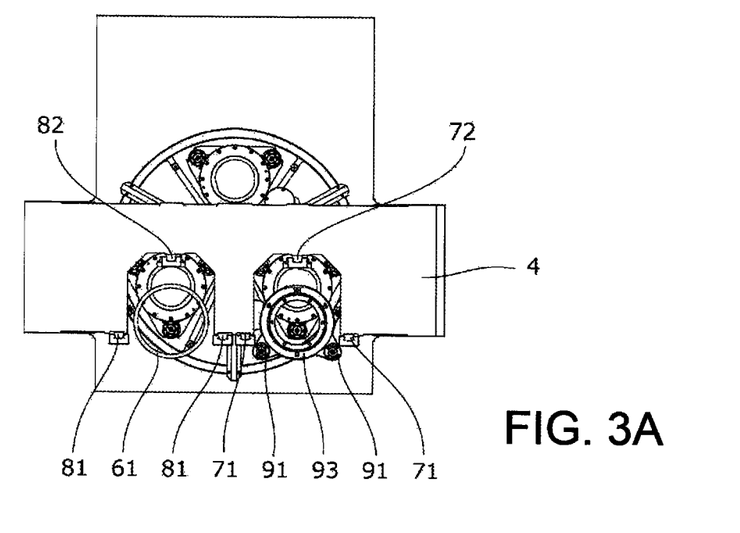
FIGS. 3A-B are a plan view from which one portion of the processing device shown in FIG. 1 is omitted.
Figure 3B:
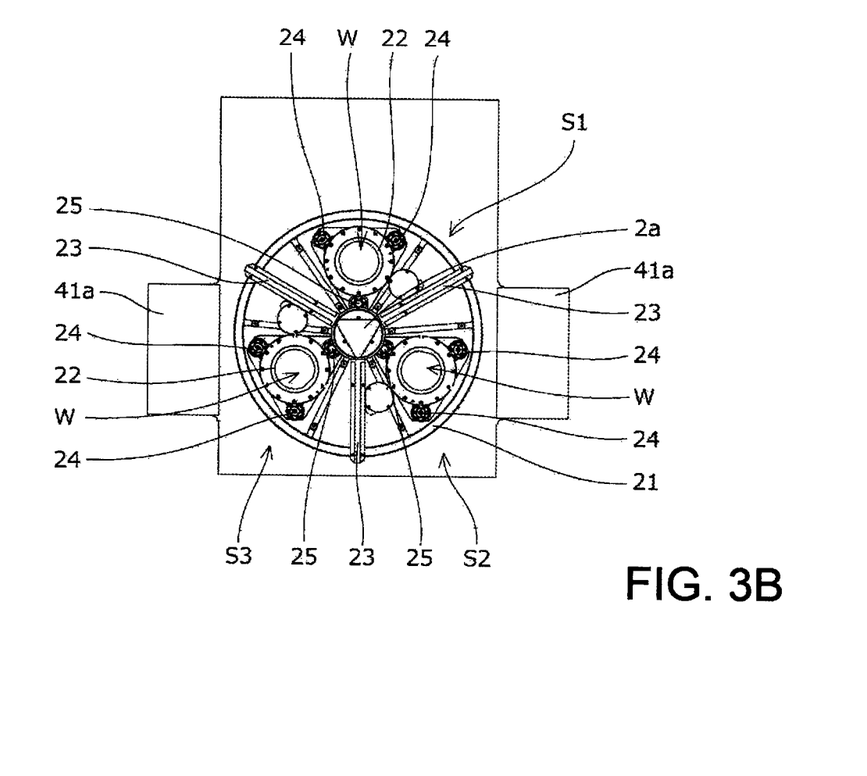
Figure 4:
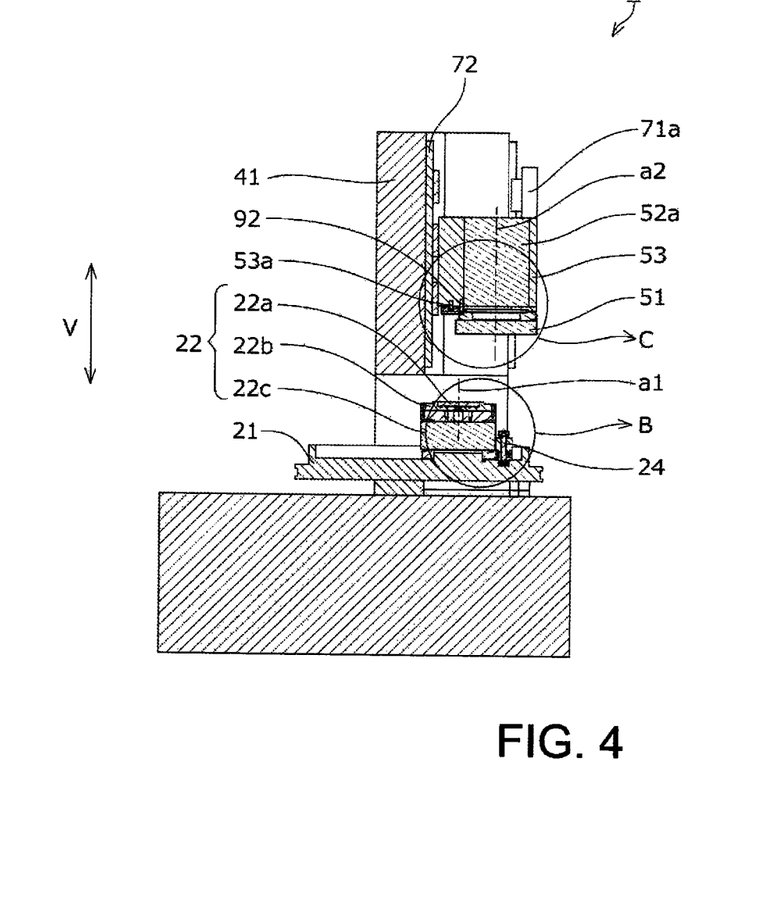
FIG. 4 is a cross-sectional view taken along line A-A of FIG. 2.
Figure 5:
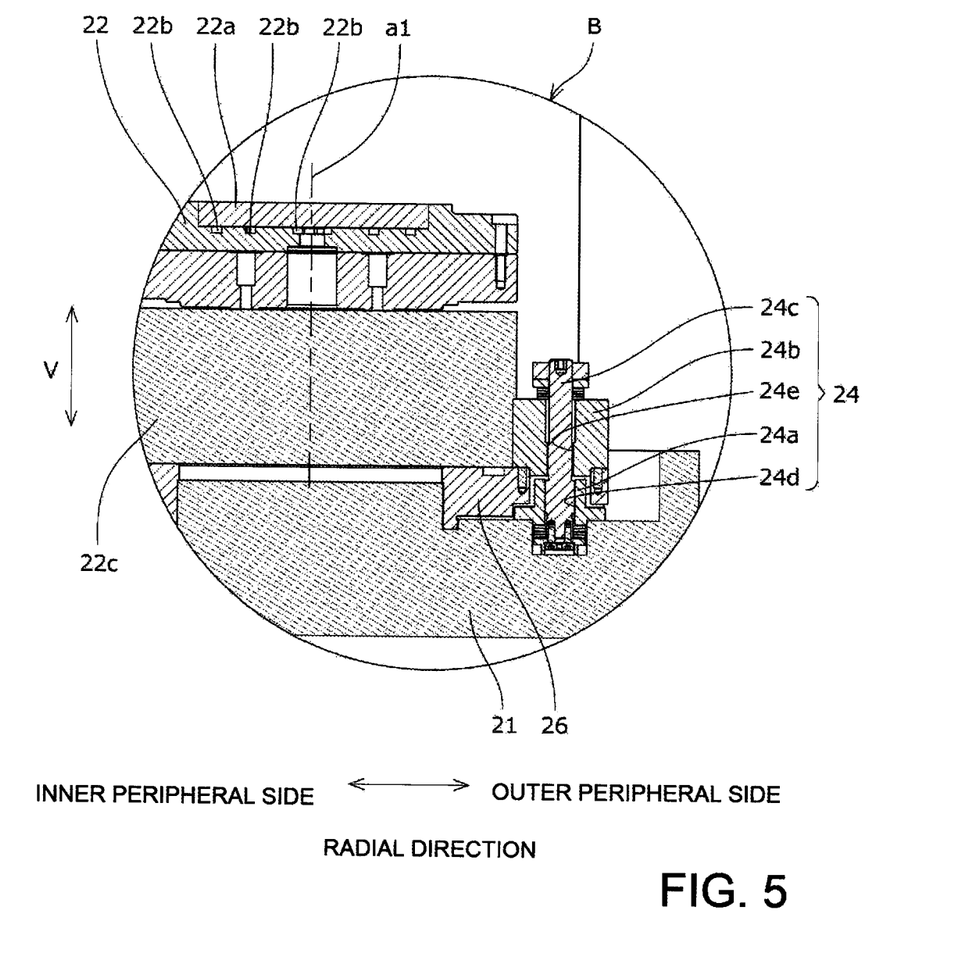
FIG. 5 is a partially enlarged view showing a B portion in FIG. 4.

FIG. 1 is a perspective view showing a basic structure of a processing device 1. FIG. 2 is a front view showing the processing device 1. FIG. 3A is a plan view showing the processing device 1 from which a first spindle 52 and a second spindle 62 of FIG. 1 are omitted. FIG. 3B is a plan view of the processing device 1 from which a column 4 of FIG. 3A is omitted. FIG. 4 is a cross-sectional view taken along an A-A line of FIG. 2. FIG. 5 is a partially enlarged view showing a B portion of FIG. 4.

The processing device 1 continuously carries out a grinding process on a wafer by using two grindstones that are arranged in parallel with each other. The processing device 1 grinds the rear surface of a wafer W so as to be formed into a thin film. The wafer W to be subjected to the grinding process by using the processing device 1 is preferably prepared as a material having high hardness and high brittleness, such as a silicon wafer, a silicon carbide wafer or the like; however, the present invention is not intended to be limited by these. The processing device 1 is provided with a holding means 2 and a main unit 3 disposed above the holding means 2.

The holding means 2 is provided with an index table 21 that is rotatable around a rotation shaft 2a coupled to a motor, not shown, and three chucks 22 that are mounted on the index table 21.

The chucks 22 are disposed on a circumference with intervals of 120 degrees from one another, centered on the rotation shaft 2a. Each chuck 22 is provided with a suction body 22a that is composed of ceramic having a porous structure and embedded onto the upper surface. To a tube passage 22b formed inside the chuck 22, a vacuum source, not shown, is connected, so that the wafer W mounted on the chuck 22 is sucked by a negative pressure. The chuck 22 is coupled to a motor, not shown, and allowed to rotate around a rotation shaft a1. Below the chuck 22, an air bearing 22c is installed so that the chuck 22 can be smoothly rotated.

The holding means 2 is partitioned into an alignment stage S1, a coarse grinding stage S2 and a fine grinding stage S3. A partition plate 23 is disposed between the chucks 22 so that a processing liquid to be used in each of the stages is prevented from scattering onto the adjacent stage.

The alignment stage S1 serves as a stage that transports the wafer W onto the chuck 22 by a transporting device or the like, not shown, and adjusts the position of the wafer W at a predetermined position. The wafer W sucked and held onto the chuck 22 is transported to the coarse grinding stage S2.

The coarse grinding stage S2 serves as a stage on which the wafer W is subjected to a coarse grinding process. The wafer W coarsely ground is sent to the fine grinding stage S3.

The fine grinding stage S3 serves as a stage on which the wafer W is subjected to a fine grinding process. The wafer W finely ground is sent to the alignment stage S1, and transported from the chuck 22 by a transporting device or the like, not shown, and then housed into a rack or the like, not shown.

The main unit 3 is provided with a column 4 having an arch shape, disposed so as to straddle over the index table 2, and a coarse grinding means 5 attached to the column 4 above the coarse grinding stage S2 and a fine grinding means 6 attached to the column 4 above the fine grinding stage S3.

The column 4 is provided with a base part 41 formed into a U-letter shape when seen in a front view, and a center pillar part 42 protruding from the center of the base part 41, and is formed into an E-letter shape when seen in a plan view.

The base part 41 is disposed so as to straddle over the coarse grinding stage S2 and the fine grinding stage S3. Thus, when seen in a plan view, the alignment stage S1 is exposed toward the side of the column 4. Therefore, when the wafer W is transported to the chuck 22, or when the wafer W is transported out of the chuck 22, the transporting device or the like is allowed to access to the chuck 22 without being interfered with the column 4. By coupling two support pillars 41a installed so as to stand on the outer periphery of the index table 2, the base part 41 is increased in its rigidity.

The center pillar part 42 is disposed between the coarse grinding stage S2 and the fine grinding stage S3 when seen in a plan view. The lower end of the center pillar part 42 is extended to the upper portion of the index table 2.

Grooves 4b and 4c, which are formed as concave portions along the vertical direction V, are disposed side by side on the front face 4a of the column 4. The coarse grinding means 5 is housed in the groove 4b. Moreover, the fine grinding means 6 is housed in the groove 4c.

The coarse grinding means 5 is provided with a coarse grinding stone 51, a first spindle 52 having a lower end to which the coarse grinding stone 51 is attached and a first spindle feeding mechanism 53 that raises or lowers the first spindle 52 in the vertical direction V.

The coarse grinding stone 51 is constituted by disposing a plurality of cup-shaped grindstones onto the lower end thereof in the peripheral direction.

The first spindle 52 is provided with a saddle 52a having a lower end to which the coarse grinding stone 51 is attached and a motor, not shown, that is installed inside the saddle 52a so as to rotate the coarse grinding stone 51.

The first spindle feeding mechanism 53, which couples the saddle 52a to a rear guide 72 to be described later, sends the first spindle 52 in the vertical direction V. Additionally, from the first spindle feeding mechanism 53, an elevation means for sending the first spindle 52 is omitted; however, as the elevation means, for example, a ball screw or the like to be driven by a motor may be used.

In the main unit 3, an in-process gauge, not shown, for measuring the thickness of the wafer W is installed. When the thickness of the wafer W measured by the in-process gauge has reached a predetermined value, the first spindle feeding mechanism 53 is driven to raise the saddle 52a so that the wafer W and the coarse grinding stone 51 are separated from each other.

The fine grinding means 6 is provided with a fine grinding stone 61, a second spindle 62 having a lower end to which the fine grinding stone 61 is attached and a second spindle feeding mechanism 63 that raises or lowers the second spindle 62 in the vertical direction V. Additionally, with respect to the basic structure of the fine grinding means 6, overlapped explanations will be omitted because the basic structure is the same as that of the coarse grinding means 5.

The fine grinding stone 61 is constituted by disposing a plurality of cup-shaped grindstones onto the lower end thereof in the peripheral direction.

The second spindle 62 is provided with a saddle 62a having a lower end to which the fine grinding stone 61 is attached and a motor, not shown, that is installed inside the saddle 62a so as to rotate the fine grinding stone 61.

The second spindle feeding mechanism 63 having the same configuration as the first spindle feeding mechanism 53, which couples the saddle 62a to a rear guide 82 to be described later, sends the second spindle 62 in the vertical direction V. The driving of the second spindle feeding mechanism 63 is controlled based upon the film thickness measured by the aforementioned in-process gauge.

In the processing device 1, a first guide 7 that supports the first spindle 52 so as to slide in the vertical direction V and a second guide 8 that supports the second spindle 62 so as to slide in the vertical direction V are installed.

The first guide 7 is constituted by front guides 71 that are respectively disposed on the front faces of the base part 41 and the center pillar part 42 and a single rear guide 72 disposed in the groove 4b. The front guide 71 and the rear guide 72 are prepared, for example, as linear guides. The saddle 52a is directly attached to a slider 71a of the front guide 71. Moreover, to the rear guide 72, the saddle 52a is attached with the first spindle feeding mechanism 53 interposed therebetween.

The front guide 71 and the rear guide 72 are installed in parallel with each other along the vertical direction V. Thus, the front guide 71 and the rear guide 72 regulate the saddle 52a so as to move along the vertical direction V.

The second guide 8 is constituted by front guides 81 that are respectively disposed on the front faces of the base part 41 and the center pillar part 42 and a single rear guide 82 disposed in the groove 4b. The front guide 81 and the rear guide 82 are prepared, for example, as linear guides. To the front guide 81, the saddle 62a is directly attached. Moreover, to the rear guide 82, the saddle 62a is attached with the second spindle feeding mechanism 63 interposed therebetween.

The front guide 81 and the rear guide 82 are installed in parallel with each other along the vertical direction V. Thus, the front guide 81 and the rear guide 82 regulate the saddle 62a so as to move along the vertical direction V.

The operation of the processing device 1 is controlled by a control unit, not shown. The control unit is designed to respectively control constituent elements forming the processing device 1. The control unit is formed by using, for example, CPU, memories, or the like. Additionally, functions of the control unit may be achieved by carrying out controlling processes by the use of software, or may be achieved by operations by the use of hardware.

In this manner, the processing device 1 continuously sends the wafer W sucked and held onto the chuck 22 of the alignment stage S1, with the wafer W being mounted on the same chuck 22, in the order of the coarse grinding stage S2 and the fine grinding stage S3. Moreover, the chuck 22, which sucks the wafer W so as to be held thereon, can be formed with high rigidity in comparison with other wafer holding devices such as a belt conveyor or the like. Thus, the throughput of the grinding process can be improved, and the wafer W can be ground with high quality.

Moreover, since the column 4 can be formed with a diameter wider than that of the index table 21, with higher rigidity, resonance and falling shaft of the coarse grinding means 5 and the fine grinding means 6 caused by vertical drag generated during the grinding process of the wafer W can be suppressed so that the wafer W can be ground with high quality.

Next, explanation will be given on the holding means 2 in detail. As shown in FIG. 3(b), the holding means 2 is provided with two first movable support units 24 and a single first fixed support unit 25 that are disposed on the periphery of the chuck 22. Each of the first movable support units 24 is disposed on the outer peripheral side in the radial direction of the index table 21 relative to the chuck 22. The first fixed support units 25 are disposed on the inner peripheral side in the radial direction of the index table 21 relative to the chuck 22.

As shown in FIG. 5, each of the first movable support units 24 is a differential screw mechanism provided with a slide block 24a, a fixed block 24b and an adjustment screw 24c.

The slide block 24a is joined to the index table 21. A screw part 24d is bored on the slide block 24a in its center, and the pitch of the screw part 24d is set to, for example, 1.25 mm.

The fixed block 24b is joined to a tilt table 26 on which the chuck 22 is mounted. A screw part 24e is bored on the fixed block 24b in its center, and the pitch of the screw part 24e is smaller than that of the screw part 24d, and set to, for example, 1.00 mm.

The adjustment screw 24c is threadably inserted into the screw part 24d of the slide block 24a and the screw part 24e of the fixed block 24b. The adjustment screw 24c is forwardly rotated or reversely rotated by a driving motor, not shown. When the adjustment screw 24c rotates one time, the chuck 22 is raised or lowered by a pitch difference (0.25 mm) between the fixed block 24a and the slide block 24b.

The first fixed support unit 25 is prepared as a bolt used for fastening the tilt table 26 onto the index table 21.

In this manner, since the first movable support unit 24 raises or lowers the tilt table 26, and since the first fixed support unit 25 also fixes the tilt table 26 in the vertical direction V, an angle made by the rotation shaft a1 of the chuck 22 and the rotation shaft a2 of the coarse grinding stone 51 or the rotation shaft a3 of the fine grinding stone 61 can be controlled, in accordance with the respective amounts of the expansion or contraction of the two first movable support units 24.

Figure 6:
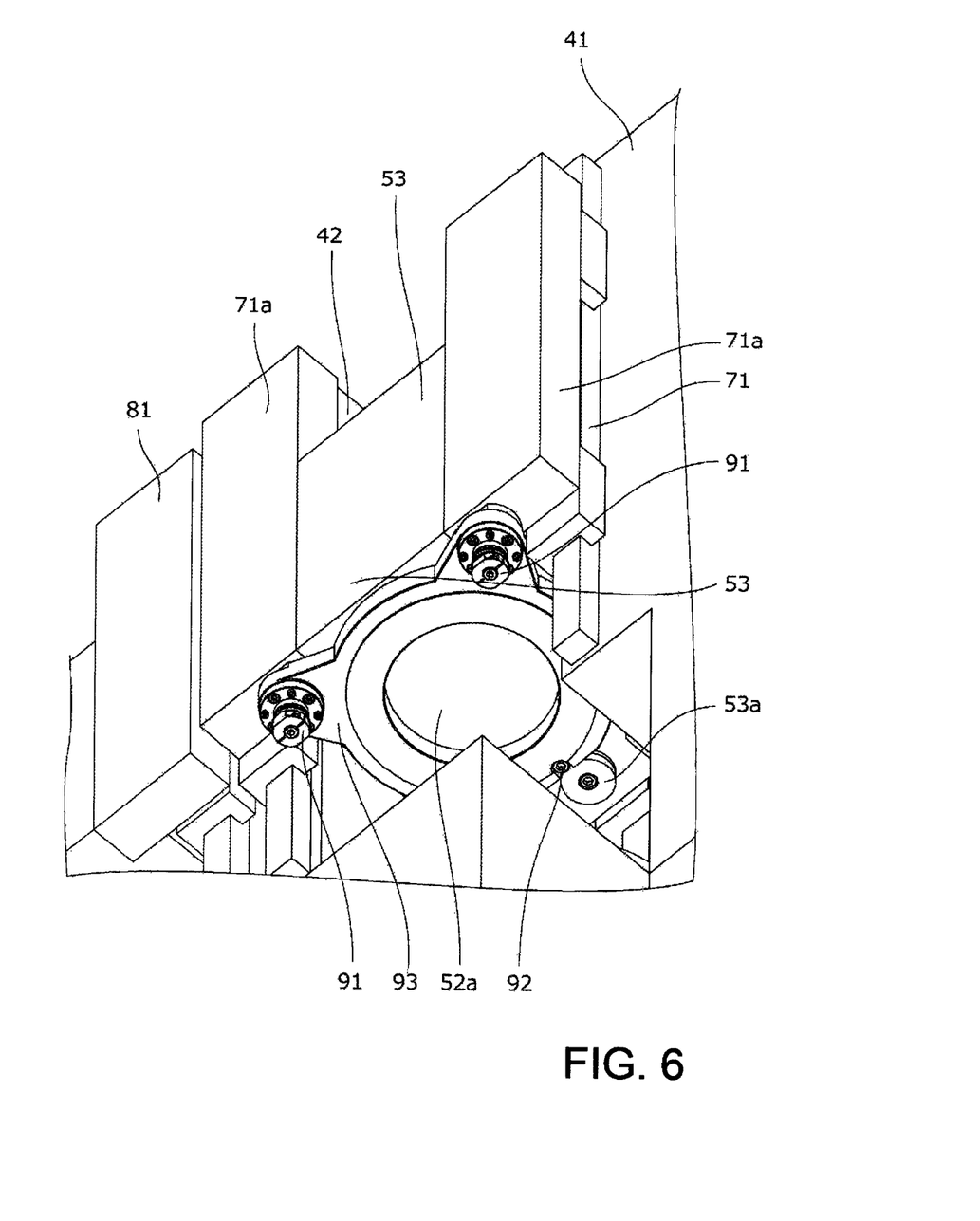
FIG. 6 is a perspective view showing a coarse grinding means shown in FIG. 1 when viewed from below.
Figure 7:
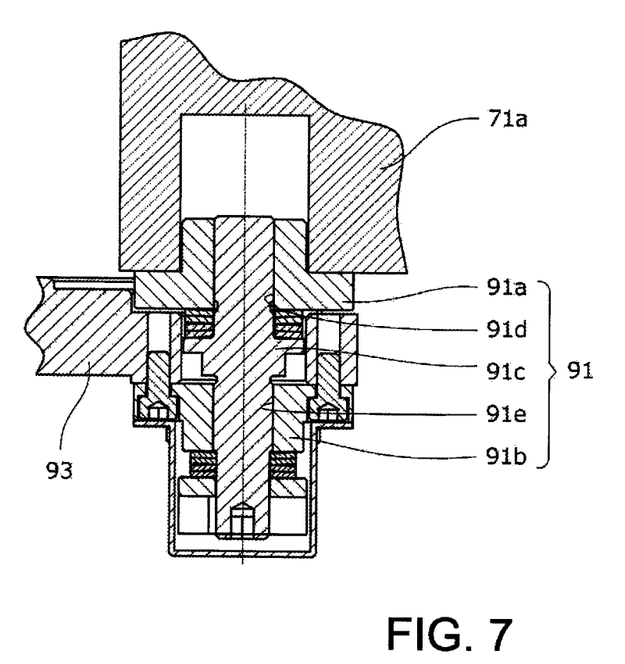
FIG. 7 is an enlarged longitudinal cross-sectional view showing a tilting means shown in FIG. 6.
Figure 8:
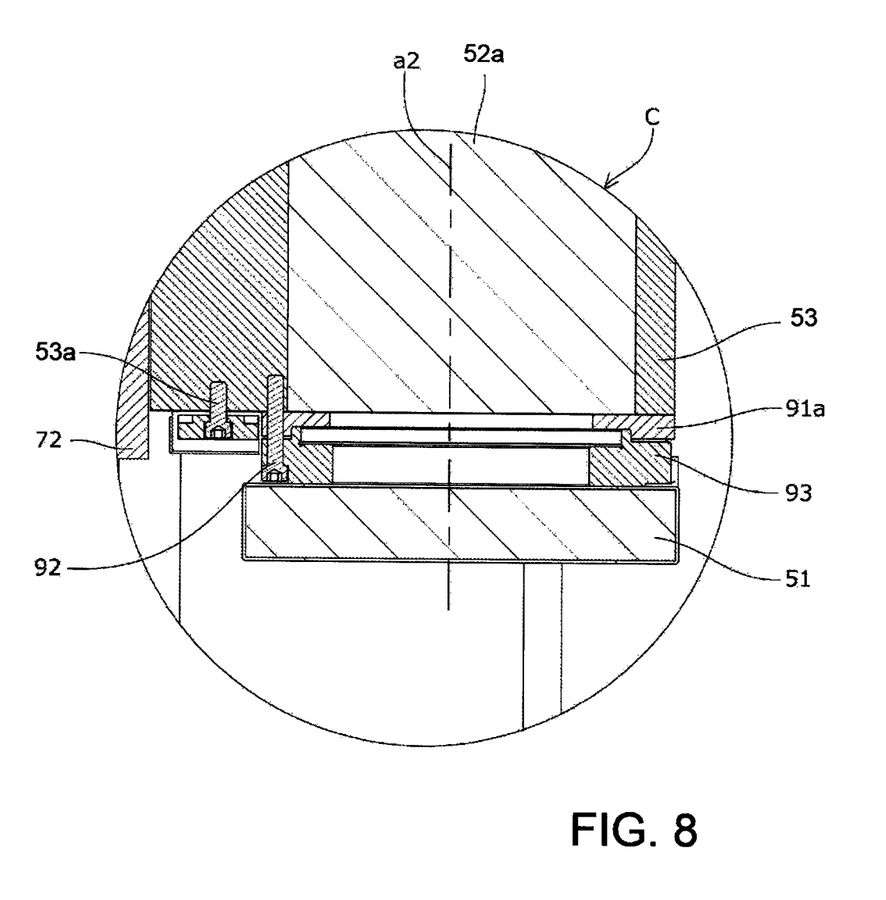
FIG. 8 is a partially enlarged view showing a C portion in FIG. 4.

Next, referring to FIGS. 6 to 8, explanation will be given on a tilt means 9 for tilting the coarse grinding stone 51. FIG. 6 is a perspective view showing the coarse grinding means 5 from which the coarse grinding stone 51 is omitted, viewed from below. FIG. 7 is an enlarged longitudinal cross-sectional view showing the tilt means 9. FIG. 8 is a partially enlarged view showing a C-portion in FIG. 4.

As shown in FIG. 6, the tilt means 9 is provided with two second movable support units 91 and a single second fixed support unit 92 that are disposed on the periphery of the coarse grinding stone 51. The second movable support units 91 are disposed on the front side relative to the coarse grinding stone 51. The second fixed support unit 92 is disposed on a side opposite to the second movable support units 91, with the coarse grinding stone 51 sandwiched therebetween.

As shown in FIG. 7, the second movable support unit 91 is a differential screw mechanism provided with a slide block 91a, a fixed block 91b and an adjustment screw 91c.

The slide block 91a is joined to a slider 71a of a front guide 71. A screw part 91d is bored on the slide block 91a in its center, and the pitch of the screw part 91d is set to, for example, 1.25 mm.

The fixed block 91b is joined to a tilt table 93. A screw part 91e is bored on the fixed block 91b in its center, and the pitch of the screw part 91e is smaller than that of the screw part 91d, and set to, for example, 1.00 mm.

The adjustment screw 91c is threadably inserted into the screw part 91d of the slide block 91a and the screw part 91e of the fixed block 91b. The adjustment screw 91c is forwardly rotated or reversely rotated by a driving motor, not shown. When the adjustment screw 91c rotates one time, a tilt table 93 is raised or lowered by a pitch difference (0.25 mm) between the slide block 91a and the fixed block 91b.

As shown in FIG. 8, the second fixed support unit 92 is prepared as a bolt used for fastening the tilt table 93 onto the first spindle feeding mechanism 53. Additionally, reference numeral 53a in FIG. 8 corresponds to a lower end of a ball screw serving as an elevation means for feeding the first spindle 52.

In this manner, since the second movable support unit 91 raises or lowers the tilt table 93, and since the second fixed support unit 92 also fixes the tilt table 93 in the vertical direction V, an angle made by the rotation shaft a2 of the coarse grinding stone 51 and the rotation shaft a1 of the chuck 22 can be controlled in accordance with the respective amounts of the expansion or contraction of the two second movable support units 91.

Figure 9:
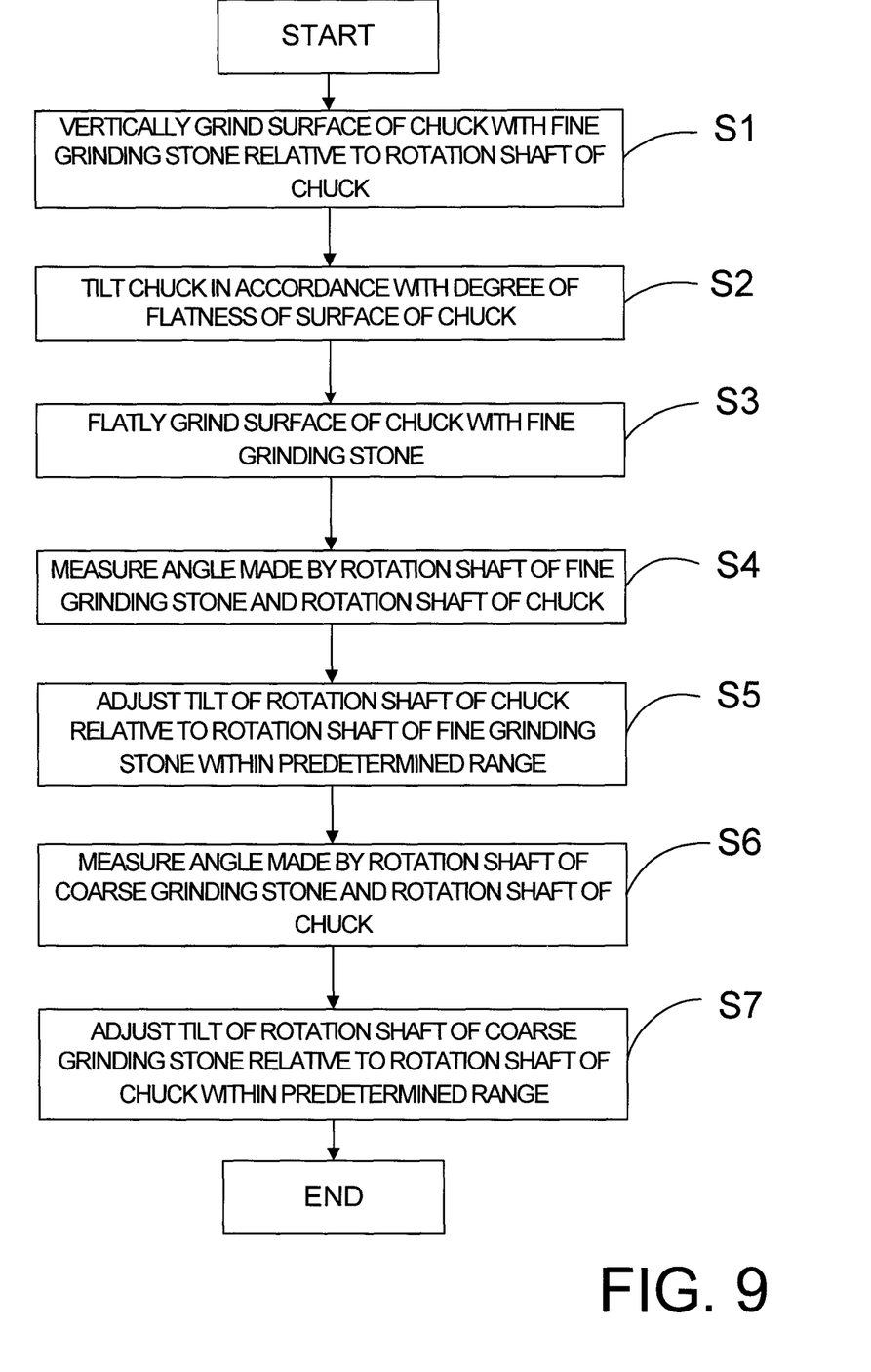
FIG. 9 is a flow chart showing a sequence of processes of a setting method for the processing device.

Next, referring to FIG. 9, explanation will be given on a sequence of processes of a setting method of the processing device 1 to be carried out prior to the execution of the aforementioned grinding process by the processing device 1. FIG. 9 is a flow chart showing the sequence of processes of the setting method of the processing device 1.

First, surfaces (chuck faces) 22a of three chucks 22 are respectively ground by the fine grinding stone 61 (S1). The chuck faces 22a after the grinding process are formed so as to be made vertical to the rotation shaft a1 of each of the chucks 22.

Next, the degree of flatness of each of the chuck faces 22a of the respective chucks 22 is measured, and by driving the first movable support unit 24, the chucks 22 are respectively tilted (S2). The degree of flatness of the chuck face 22a is measured by a generally known measuring means. In the control unit, the ground amount in response to the contact state between the chuck 22 and the fine grinding stone 61 and the amount of expansion or contraction of the first movable support unit 24 corresponding to the ground amount are preliminarily stored so that based upon the surface state or the like of the chuck face 22a, the chuck 22 is tilted at an optimal angle.

Next, the fine grinding stone 61 flatly grinds the chuck face 22a (S3). Thus, the chuck face 22a is formed flatly as well as vertically to the rotation shaft a1 of the chuck 22.

Next, the angle made by the rotation shaft a1 of the chuck 22 and the rotation shaft a3 of the fine grinding stone 61 is measured (S4), and by expanding or contracting the first movable support unit 24, the chuck 22 is tilted so as to allow the angle made by rotation shaft a1 of the chuck 22 and the rotation shaft a3 of the fine grinding stone 61 to be set within a predetermined range (for example, within 0.06°) (S5).

Next, the angle made by the rotation shaft a1 of the chuck 22 and the rotation shaft a2 of the coarse grinding stone 51 is measured (S6), and by expanding or contracting the second movable support unit 91, the coarse grinding stone 51 is tilted so as to allow the angle made by rotation shaft a1 of the chuck 22 and the rotation shaft a2 of the coarse grinding stone 51 to be set within a predetermined range (for example, within 0.06°) (S7).

In this manner, by disposing the first movable support unit 24 and the first fixed support unit 25 so as to surround each chuck 22, the above-mentioned processing device 1 is designed such that when the first movable support unit 24 is expanded or contracted, each of the chucks 22 is tilted based upon the first fixed support unit 25 so as to allow the tilt angle of each chuck 22 to become individually adjustable; thus, variations in the degree of in-plane flatness of the wafer W can be suppressed among the plurality of the chucks 22.

Additionally, the first movable support unit 24 and the second movable support unit 91 are not intended to be limited by the above-mentioned differential screw mechanism, and any configuration may be used.

Additionally, in the present invention, various modifications may be made within a scope not departing from the spirit of the present invention, and needless to say, those modifications are included in the present invention.

EXPLANATION OF REFERENCE NUMERALS

1 . . . processing device
2 . . . holding means
2a . . . rotation shaft
21 . . . index table
22 . . . chuck
22a . . . chuck face
23 . . . partition plate
24 . . . first movable support unit
24a . . . slide block
24b . . . fixed block
24c . . . adjustment screw
25 . . . first fixed support unit
3 . . . main unit
4 . . . column
4a . . . front face
4b . . . groove (to house coarse grinding means)
4c . . . groove (to house fine grinding means)
41 . . . base part
41a . . . support pillar
42 . . . center pillar part
5 . . . coarse grinding means
51 . . . coarse grinding stone
52 . . . first spindle
53 . . . first spindle feeding mechanism
6 . . . fine grinding means
61 . . . fine grinding stone
62 . . . second spindle
63 . . . second spindle feeding mechanism
7 . . . first guide
71 . . . front guide
71a . . . slider
72 . . . rear guide
8 . . . second guide
81 . . . front guide
82 . . . rear guide
9 . . . tilt means
91 . . . second movable support unit
91a . . . slide block
91b . . . fixed block
91c . . . adjustment screw
92 . . . second fixed support unit
93 . . . tilt table
H . . . horizontal direction
S1 . . . alignment stage
S2 . . . coarse grinding stage
S3 . . . fine grinding stage
V . . . vertical direction
W . . . wafer FIG. 5
INNER PERIPHERAL SIDE
RADIAL DIRECTION
OUTER PERIPHERAL SIDE
FIG. 9
START
S1 VERTICALLY GRIND SURFACE OF CHUCK WITH FINE GRINDING STONE RELATIVE TO ROTATION SHAFT OF CHUCK
S2 TILT CHUCK IN ACCORDANCE WITH DEGREE OF FLATNESS OF SURFACE OF CHUCK
S3 FLATLY GRIND SURFACE OF CHUCK WITH FINE GRINDING STONE
S4 MEASURE ANGLE MADE BY ROTATION SHAFT OF FINE GRINDING STONE AND ROTATION SHAFT OF CHUCK
S5 ADJUST TILT OF ROTATION SHAFT OF CHUCK RELATIVE TO ROTATION SHAFT OF FINE GRINDING STONE WITHIN PREDETERMINED RANGE
S6 MEASURE ANGLE MADE BY ROTATION SHAFT OF COARSE GRINDING STONE AND ROTATION SHAFT OF CHUCK
S7 ADJUST TILT OF ROTATION SHAFT OF COARSE GRINDING STONE RELATIVE TO ROTATION SHAFT OF CHUCK WITHIN PREDETERMINED RANGE

What is claimed is:

1. A setting method for a processing device that is carried out prior to a wafer grinding process executed by using the processing device comprising:

a column formed so as to straddle over a holding means; and a coarse grinding means and a fine grinding means formed on the column,
wherein a wafer held on the holding means is ground by the coarse grinding means and the fine grinding means,
and the holding means includes an index table that is rotatable around a center rotation shaft of the holding means; a plurality of chucks concentrically disposed centered on the center rotation shaft on the index table; two first movable support units, each disposed on an outer peripheral side in a radial direction of the index table relative to each one of said plurality of chucks and interposed between the index table and each one of said plurality of chucks so as to be freely expanded or contracted in a vertical direction; and a first fixed support unit that is disposed on an inner peripheral side in the radial direction of the index table relative to each one of said plurality of chucks and fixes one portion of each one of said plurality of chucks in the vertical direction on the index table, the coarse grinding means includes a coarse grinding stone for use in grinding the wafer; a spindle for rotating the coarse grinding stone; a guide rail that slidably supports the spindle on the column and a tilting means for tilting the coarse grinding stone, and wherein the tilting means includes a tilt table interposed between the coarse grinding stone and the spindle; two second movable support units that are interposed between the guide rail and the tilt table and freely expanded or contracted in the vertical direction; and a second fixed support unit that is disposed on a side opposite to the two second movable support units so as to fix one portion of the tilt table in the vertical direction, forming a chuck face of a respective one of said plurality of chucks flatly as well as vertically relative to a rotation shaft of a respective one of said plurality of chucks by a fine grinding stone of the fine grinding means;

measuring a first angle made between the rotation shaft of a respective one of said plurality of chucks and a rotation shaft of the fine grinding stone;

tilting the rotation shaft of a respective one of said plurality of chucks by the two first movable support units so as to set the rotation shaft of a respective one of said plurality of chucks to the first angle and to be included within a predetermined range relative to the rotation shaft of the fine grinding stone prior to the wafer grinding process;

measuring a second angle made between the rotation shaft of a respective one of said plurality of chucks and a rotation shaft of the course grinding stone; and tilting the rotation shaft of the coarse grinding stone so as to set the rotation shaft of the coarse grinding stone to the second angle and to be included within a predetermined range relative to the rotation shaft of a respective one of said plurality of chucks prior to the wafer grinding process.

* * * * *